(12) United States Patent
Kamiyama

(10) Patent No.: US 10,103,096 B2
(45) Date of Patent: Oct. 16, 2018

(54) SEMICONDUCTOR DEVICE

(71) Applicant: SHINDENGEN ELECTRIC MANUFACTURING CO., LTD., Tokyo (JP)

(72) Inventor: Yoshihiro Kamiyama, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 15 days.

(21) Appl. No.: 15/506,426

(22) PCT Filed: Mar. 11, 2016

(86) PCT No.: PCT/JP2016/057749
§ 371 (c)(1),
(2) Date: Feb. 24, 2017

(87) PCT Pub. No.: WO2017/154195
PCT Pub. Date: Sep. 14, 2017

(65) Prior Publication Data
US 2018/0166376 A1    Jun. 14, 2018

(51) Int. Cl.
| | |
|---|---|
| H01L 23/50 | (2006.01) |
| H01L 25/07 | (2006.01) |
| H01L 25/11 | (2006.01) |
| H01L 23/528 | (2006.01) |
| H01L 23/495 | (2006.01) |

(52) U.S. Cl.
CPC ........ *H01L 23/50* (2013.01); *H01L 23/49541* (2013.01); *H01L 23/49562* (2013.01);
(Continued)

(58) Field of Classification Search
CPC ......... H01L 23/49562; H01L 23/49575; H01L 23/48; H01L 23/49; H01L 23/072;
(Continued)

(56) References Cited

U.S. PATENT DOCUMENTS

| | | |
|---|---|---|
| 5,544,038 A | 8/1996 | Fisher et al. |
| 2002/0011350 A1 | 1/2002 | Kono |

(Continued)

FOREIGN PATENT DOCUMENTS

| | | |
|---|---|---|
| EP | 2 858 110 A1 | 4/2015 |
| JP | 2010-104204 | 5/2010 |

(Continued)

OTHER PUBLICATIONS

Netherlands Search Report dated Nov. 2, 2017 in Netherlands Application No. NL 2018489, with English translation (17 pages).
International Search Report for PCT/JP2016/057749, dated May 31, 2016, 3 pages.

*Primary Examiner* — Joseph Galvin, III
(74) *Attorney, Agent, or Firm* — Nixon & Vanderhye P.C.

(57) ABSTRACT

A semiconductor device (10) of the present invention includes at least one circuit unit (41, 42, 43) which includes: a device main body (20); and a power supply terminal (31, 32, 33), an output terminal (34, 35, 36), and a ground terminal (37, 38, 39) which protrude from the device main body (20). The output terminal (34, 35, 36) protrudes from the device main body (20) in an opposite direction to the ground terminal (37, 38, 39). The power supply terminal (31, 32, 33) protrudes in a same direction as the ground terminal (37, 38, 39) and is positioned so as to be shifted in a direction orthogonal to an arrangement direction of the output terminal (34, 35, 36) and the ground terminal (37, 38, 39).

10 Claims, 5 Drawing Sheets

(52) U.S. Cl.
CPC .... *H01L 23/49575* (2013.01); *H01L 23/5286* (2013.01); *H01L 25/072* (2013.01); *H01L 25/115* (2013.01); *H01L 23/4952* (2013.01); *H01L 23/49524* (2013.01); *H01L 2224/0603* (2013.01); *H01L 2224/40245* (2013.01); *H01L 2224/48247* (2013.01); *H01L 2224/4903* (2013.01)

(58) Field of Classification Search
CPC ......... H01L 23/49537; H01L 23/49541; H01L 23/49589; H01L 23/49844
See application file for complete search history.

(56) References Cited

U.S. PATENT DOCUMENTS

| | | | |
|---|---|---|---|
| 2011/0156229 A1* | 6/2011 | Shinohara | H01L 23/49531 257/676 |
| 2011/0291236 A1* | 12/2011 | Hayashi | H01L 23/49537 257/532 |
| 2012/0306299 A1 | 12/2012 | Masuzawa et al. | |
| 2013/0047426 A1 | 2/2013 | Kakimoto et al. | |
| 2015/0014746 A1 | 1/2015 | Inada et al. | |
| 2016/0351488 A1* | 12/2016 | Kamiyama | H01L 23/49861 |

FOREIGN PATENT DOCUMENTS

| | | |
|---|---|---|
| JP | 2011-238906 | 11/2011 |
| JP | 5067679 | 11/2012 |
| JP | 2013-051376 | 3/2013 |
| JP | 2015-106601 | 6/2015 |

* cited by examiner

SEMICONDUCTOR DEVICE

This application is the U.S. national phase of International Application No. PCT/JP2016/057749 filed Mar. 11, 2016, which designated the U.S., the entire contents of which is hereby incorporated by reference.

TECHNICAL FIELD

The present invention relates to a semiconductor device.

BACKGROUND ART

Conventionally, for example, as shown in FIG. 5, a semiconductor device 200 includes power supply terminals 201, 205, output terminals 202, 204, 206, and ground terminals 203, 207. In the semiconductor device 200, these three types of terminals protrude from a sealing resin 230 of a device main body 220 in the same direction. On the other hand, gate terminals 208 to 213 protrude from the sealing resin 230 of the device main body 220 in a direction opposite to the above-described three types of terminals (for example, Patent Document 1).

The semiconductor device 200 includes: a first current path 301 in which a current flows from the power supply terminal 201 via circuits of the device body 220 to the output terminal 202; and a second current path 302 in which a current flows between the output terminal 202 and the ground terminal 203.

The semiconductor device 200 includes: a first current path 303 in which a current flows from the power supply terminal 205 via the circuits of the device main body 220 to the output terminal 204; and a second current path 304 in which a current flows between the output terminal 204 and the ground terminal 203.

The semiconductor device 200 includes: a first current path 305 in which a current flows from the power supply terminal 205 via the circuits of the device body 220 to the output terminal 206; and a second current path 306 in which a current flows between the output terminal 206 and the ground terminal 207.

In the semiconductor device 200, for example, the first current path 301 has a folded-back portion 301A for changing the direction of the current flow. The second current path 302 has a folded-back portion 302A for changing the direction of the current flow.

CITATION LIST

Patent Document

[Patent Document 1] Japanese Patent No. 5067679

DISCLOSURE OF THE INVENTION

Problems to be Solved by the Invention

However, if the folded-back portion 301A of the first current path 301 and the folded-back portion 302A of the second current path 302 are present, the respective current paths become longer. Additionally, places for providing the folded-back portions 3014 and 302A are required in the device main body 220. For this reason, the dimension of the semiconductor device 200, particularly the dimension in the arrangement direction of the terminals (the left-right direction of the sheet of FIG. 5), increases, thereby making it difficult to downsize the semiconductor device 200 in some cases.

The present invention has been made to solve the above problems, and its object is to provide a semiconductor device which can shorten the length of current paths and achieve miniaturization thereof.

Means for Solving the Problems

In order to solve the above problem, a semiconductor device according to one aspect of the present invention includes at least one circuit unit which includes: a device main body; and a power supply terminal, an output terminal, and a ground terminal which protrude from the device main body. The output terminal protrudes from the device main body in an opposite direction to the ground terminal. The power supply terminal protrudes in a same direction as the ground terminal and is positioned so as to be shifted in a direction orthogonal to an arrangement direction of the output terminal and the ground terminal.

Effects of the Invention

According to the semiconductor device of the present invention, the output terminal protrudes from the device main body in an opposite direction to the ground terminal, while the power supply terminal protrudes in a same direction as the ground terminal and is positioned so as to be shifted in a direction orthogonal to an arrangement direction of the output terminal and the ground terminal. Thereby, the length of the current path can be shortened. Further, it is possible to reduce the size of the semiconductor device.

MODE FOR CARRYING OUT THE INVENTION

Hereinafter, a semiconductor device according to an embodiment of the present invention will be described with reference to the drawings.

Figure 1:
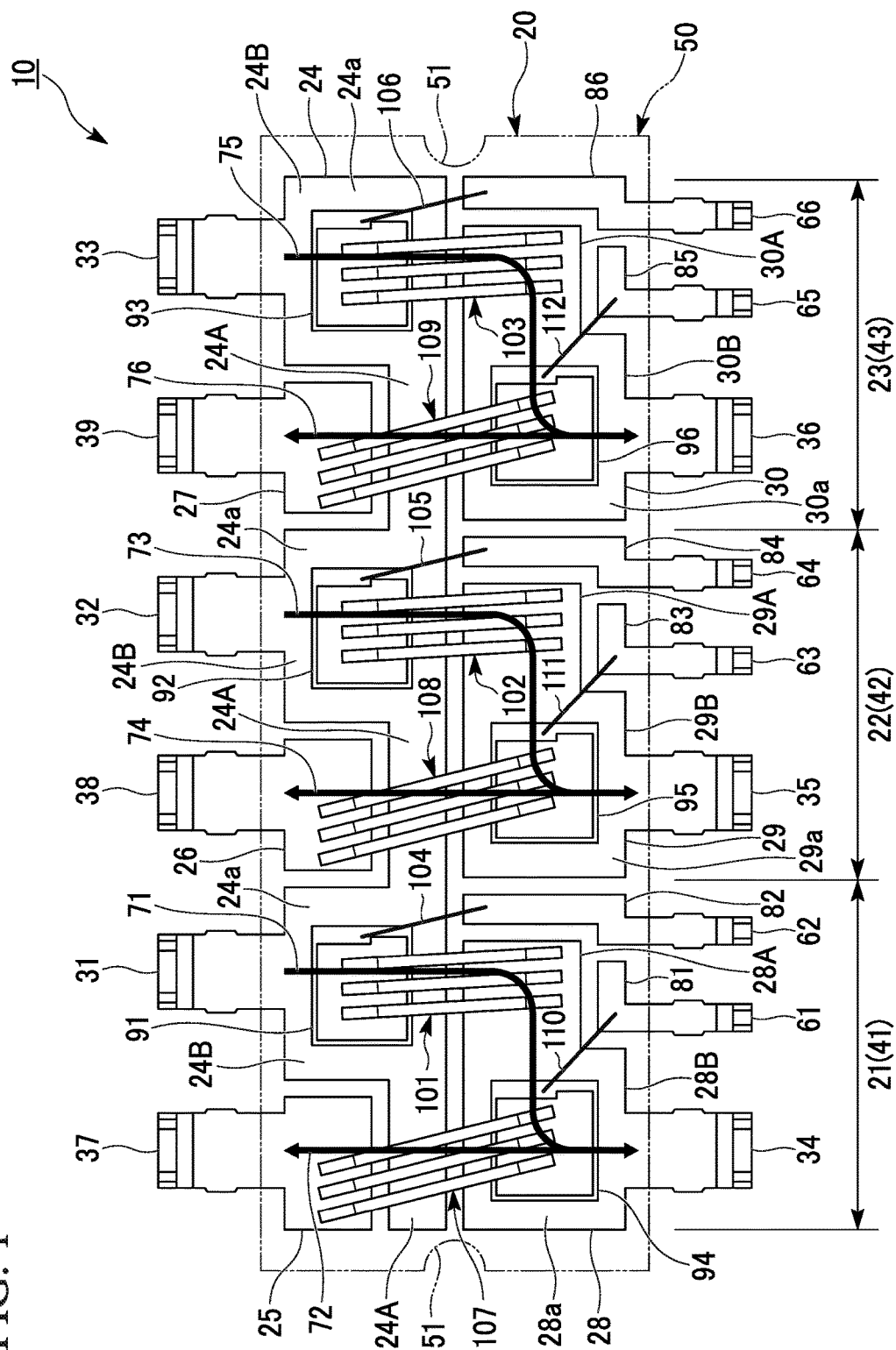
FIG. 1 is a structural plan view showing an example of a semiconductor device according to the present embodiment.

As shown in FIG. 1, a semiconductor device 10 of the present embodiment includes circuit units 41, 42, 43. The circuit units 41, 42, 43 include: a device main body 20; and respective power source terminals 31, 32, 33, respective output terminals 34, 35, 36, and respective ground terminals 37, 38, 39, which protrude from the device main body 20.

The device main body 20 is formed by integrating device units 21, 22, 23 corresponding respectively to the circuit units 41, 42, 43. The circuit units 41, 42, 43 are arranged in this order along a long-side direction X (left-right direction in FIG. 1) of the semiconductor device 10.

The first circuit unit 41 includes: a first device unit 21; and a first power supply terminal board 31, a first output terminal 34, and a first ground terminal 37 which protrude from the first device unit 21.

The second circuit unit 42 includes: a second device unit 22; and a second power supply terminal 32, a second output terminal 35, and a second ground terminal 38 which protrude from the second device unit 22.

The third circuit unit 43 includes: a third device unit 23; and a third power supply terminal 33, a third output terminal 35, and a third ground terminal 39 which protrude from the third device unit 23.

The first circuit unit 41, the second circuit unit 42, and the third circuit unit 43 have substantially the same shape when viewed in plan view.

The device main body 20 may include a sealing resin 50 sealing the circuit units 41, 42, 43. In this case, the power supply terminals 31, 32, 33, the output terminals 34, 35, 36, and the ground terminals 37, 38, 39 protrude from the sealing resin 50.

The output terminals 34, 35, 36 protrude from the device main body 20 in an opposite direction to the ground terminals 37, 38, 39. In other words, the output terminals 34, 35, 36 and the ground terminals 37, 38, 39 protrude perpendicularly from the side surfaces, along the long-side direction, of the device main body 20 in respectively opposite directions.

The power supply terminals 31, 32, 33 protrude in the same direction as the ground terminals 37, 38, 39. The power supply terminals 31, 32, 33 are arranged so as to be shifted in a direction orthogonal to an arrangement direction of the output terminals 34, 35, 36 and the ground terminals 37, 38, 39.

The arrangement direction of the output terminals 34, 35, 36 and the ground terminals 37, 38, 39 indicates a direction from the first output terminal 34 toward the first ground terminal 37, a direction from the second output terminal 35 toward the second ground terminal 38, and the direction from the third output terminal 36 toward the third ground terminal 39. In other words, the arrangement such that the power supply terminals 31, 32, 33 are shifted in the direction orthogonal to the arrangement direction of the output terminals 34, 35, 36 and the ground terminals 37, 38, 39 means that the power supply terminals 31, 32, 33 are not on a straight line connecting the output terminals 34, 35, 36 and the ground terminals 37, 38, 39.

The circuit units 41, 42, 43 may include gate terminals 61 to 66 protruding from the device main body 20 (device units 21, 22, 23). In this case, the power supply terminals 31, 32, 33 protrude from the device main body 20 in an opposite direction to the gate terminals 61 to 66. In other words, the power supply terminals 31, 32, 33 and the gate terminals 61 to 66 protrude perpendicularly from the side surfaces, along the long-side direction, of the device main body 20 in respectively opposite directions.

In the case where the device main body 20 includes the sealing resin 50, the gate terminals 61 to 66 protrude from the sealing resin 50.

It is preferable that the power supply terminals 31, 32, 33, the output terminals 34, 35, 36, and the ground terminals 37, 38, 39 are larger in width than the gate terminals 61 to 66.

It is preferable in the device main body 20 that the length of the first current path 71 from the first power supply terminal 31 to the first output terminal 34, the length of the first current path 73 from the second power supply terminal 32 to the second output terminal 35, and the length of the first current path 75 from the third power supply terminal 33 to the third output terminal 36 correspond to one another. The fact that the length of the first current path 71, the length of the first current path 73, and the length of the first current path 75 correspond to one another means not only that the lengths of these three current paths are equal to one another, but also that the difference in length among these three current paths is very small.

It is preferable in the device main body 20 that the length of the second current path 72 from the first output terminal 34 to the first ground terminal 37, the length of the second current path 74 from the second output terminal 35 to the second ground terminal 38, and the length of the second current path 76 from the three output terminal 36 to the third ground terminal 39 correspond to one another.

The fact that the length of the second current path 72, the length of the second current path 74, and the length of the second current path 76 correspond to one another means not only that the lengths of these three current paths are equal to one another, but also that the difference in length among these three current paths is very small.

The device main body 20 includes: a power supply wiring board 24 in common to the three device units 21, 22, 23; ground wiring boards 25, 26, 27 provided respectively in the device units 21, 22, 23; and output wiring boards 28, 29, 30 provided respectively in the device units 21, 22, 23.

The power supply wiring board 24, the ground wiring boards 25, 26, 27, and the output wiring boards 28, 29, 30 are arranged separately from one another.

The power supply wiring board 24 extends in the long-side direction of the device main body 20. In plan view, the power supply wiring board 24 has a periodic concave-convex shape along the long-side direction. In other words, the power supply wiring board 24 has three pairs of narrow portions 24A and wide portions 24B continuously extending in the direction orthogonal to the arrangement direction of the output terminals 34, 35, 36 and the ground terminals 37, 38, 39. The narrow portion 24A is small in width in the arrangement direction of the output terminals 34, 35, 36 and the ground terminals 37, 38, 39. The wide portion 24B is larger in width than the narrow portion 24A in the arrangement direction of the output terminals 34, 35, 36 and the ground terminals 37, 38, 39. The wide portion 24B protrudes on one side of the narrow portion 24A (toward the upper side in FIG. 1) in the arrangement direction of the output terminals 34, 35, 36 and the ground terminals 37, 38, 39.

The power supply wiring board 24 extends over the entire three circuit units 41, 42, 43.

The three power supply terminals 31, 32, 33 are connected to the respective wide portions 24B of the power supply wiring board 24, and protrude from the respective wide portions 24B. In other words, the three power supply terminals 31, 32, 33 and the power supply wiring board 24 are integrally formed.

The ground wiring boards 25, 27 are arranged so as to be adjacent to the respective narrow portions 24A of the power supply wiring board 24 on a surface side of the power supply wiring board 24 toward which the wide portions 24B of the power supply wiring board 24 protrude.

The ground terminals 37, 38, 39 are connected respectively to the ground wiring boards 25, 26, 27, and protrude respectively from the ground wiring boards 25, 26, 27. In other words, the ground terminals 37, 38, 39 and the ground wiring boards 25, 26, 27 are integrally formed.

The output wiring boards 28, 29, 30 are arranged on a surface side of the power supply wiring board 24 that is opposite to the surface side thereof toward which the wide portions 24B of the power supply wiring board 24 protrude.

In plan view, the output wiring board 28 (29, 30) has the narrow portion 28A (29A, 30A) and the wide portion 28B (29B, 30B) continuously extending in a direction orthogonal to the arrangement direction of the output terminals 34, 35, 36 and the ground terminals 37, 38, 39. The narrow portions 28A, 29A, 30A are small in width in the arrangement direction of the output terminals 34, 35, 36 and the ground terminals 37, 38, 39. The wide portions 28B, 29B, 30B are larger in width than the narrow portions 28A, 29A, 30A in the arrangement direction of the output terminals 34, 35, 36 and the ground terminals 37, 38, 39. The wide portions 28B, 29B, 30B protrude on one side of the narrow portions 28A, 29A, 30A (toward the lower side of FIG. 1) in the arrangement direction of the output terminals 34, 35, 36 and the ground terminals 37, 38, 39.

The output terminals 34, 35, 36 are connected respectively to the wide portions 28B, 29B, 30B of the output wiring boards 28, 29, 30, and protrude respectively from the wide portions 28B, 29B, 30B. In other words, the output terminals 34, 35, 36 and the output wiring boards 28, 29, 30 are integrally formed.

The ground wiring boards 25, 26, 27 are arranged so as to respectively face the wide portions 28B, 29B, 30B of the output wiring boards 28, 29, 30 via the narrow portions 24A of the power supply wiring board 24.

The wide portions 24B of the power supply wiring board 24 are arranged so as to respectively face the narrow portions 28A, 29A, 30A of the output wiring boards 28, 29, 30.

In a case where the circuit units 41, 42, 43 include the gate terminals 61 to 66, the device main body 20 includes the gate wiring boards 81 to 86 provided respectively in the device units 21, 22, 23.

The gate terminals 61 to 66 are connected respectively to the gate wiring boards 81 to 86, and protrude respectively from the gate wiring boards 81 to 86.

In the first circuit unit 41, the first gate wiring board 81 is disposed so as to be adjacent to the narrow portion 28A of the first output wiring board 28. Additionally, the second gate wiring board 82 is disposed between the first output wiring board 28 and the second output wiring board 29.

In the second circuit unit 42, the third gate wiring board 83 is disposed so as to be adjacent to the narrow portion 29A of the second output wiring board 29. Additionally, the fourth gate wiring board 84 is disposed between the second output wiring board 29 and the third output wiring board 30.

In the third circuit unit 43, the fifth gate wiring board 85 is disposed so as to be adjacent to the narrow portion 30A of the third output wiring board 30. Additionally, the sixth gate wiring board 86 is disposed adjacent to the third output wiring board 30 along the arrangement direction of the third output terminal 36 and the third ground terminal 39.

The semiconductor elements 91, 92, 93 are mounted on first main surface 24a of the respectively portions (the wide portions 24B) of the power supply wiring board 24, which are adjacent to base end portions of the power supply terminals 31, 32, 33. These semiconductor elements 91, 92, 93 are electrically connected respectively to the narrow portions 28A, 29A, 30A of the output wiring boards 28, 29, 30 via connectors 101, 102, 103.

The semiconductor elements 91, 92, 93 are electrically connected respectively to the gate wiring boards 82, 84, 86 via connectors 104, 105, 106.

The semiconductor elements 94, 95, 96 are mounted respectively on first main surfaces 28a, 29a, 30a of the portions (the wide portions 28B, 29B, 30B) of the output wiring boards 28, 29, 30, which are adjacent to base end portions of the output terminals 34, 35, 36. These semiconductor elements 94, 95, 96 are electrically connected respectively to the ground wiring boards 25, 26, 27 via connectors 107, 108, 109.

The semiconductor elements 94, 95, 96 are electrically connected respectively to the gate wiring boards 81, 83, 85 via connectors 110, 111, 112.

As shown in FIG. 1, bonding wires are used as the connectors 101, 102, 103, 107, 108, 109. Additionally, bonding wires are used as the connectors 104, 105, 106, 110, 111, 112.

Tip end portions of the power supply terminals 31, 32, 33 extend in a thickness (board thickness) direction of the power supply wiring board 24.

Tip end portions of the output terminals 34, 35, 36 extend in a thickness (board thickness) direction of the output wiring boards 28, 29, 30.

Tip end portions of the ground terminals 37, 38, 39 extend in a thickness (board thickness) direction of the ground wiring boards 25, 26, 27.

In the first circuit unit 41, the first current path 71 includes the first power supply terminal board 31, the power supply wiring board 24, the first semiconductor element 91, the first connector 101, the first output wiring board 28, and the first output terminal 34.

In the second circuit unit 42, the first current path 73 includes the second power supply terminal board 32, the power supply wiring board 24, the second semiconductor element 92, the second connector 102, the second output wiring board 29, and the second output terminal 35.

In the third circuit unit 43, the first current path 75 includes the third power supply terminal board 33, the power supply wiring board 24, the third semiconductor element 93, the third connector 103, the third output wiring board 30, and the third output terminal 36.

In the first circuit unit 41, the second current path 72 includes the first output terminal 34, the first output wiring board 28, the fourth semiconductor element 94, the fourth connector 107, the first ground wiring board 25, and the first ground terminal 37.

In the second circuit unit 42, the second current path 74 includes the second output terminal 35, the second output wiring board 29, the fifth semiconductor element 95, the fifth connector 108, the second ground wiring board 26, and the second ground terminal 38.

In the third circuit unit 43, the second current path 76 includes the third output terminal 36, the third output wiring board 30, the sixth semiconductor element 96, the sixth connector 109, the third ground wiring board 27, and the third ground terminal 39 form.

The semiconductor elements 91, 92, 93 disposed respectively on the three wide portions 24B of the power supply wiring board 24 are arranged separately in the direction orthogonal to the arrangement direction of the output terminals 34, 35, 36 and the ground terminals 37, 38, 39 to constitute a first element group.

Meanwhile, the semiconductor elements 94, 95, 96 disposed respectively on the wide portions 28B, 29B, 30B of the three output wiring boards 28, 29, 30 are arranged separately in the direction orthogonal to the arrangement direction of the output terminals 34, 35, 36 and the ground terminals 37, 38, 39 to constitute a second element group.

The center of the fifth semiconductor element 95 included in the second element group is disposed between the centers of the first semiconductor element 91 and the second semiconductor element 92 which are included in the first element group, in the direction orthogonal to the arrangement direction of the output terminals 34, 35, 36 and the ground terminals 37, 38, 39.

Additionally, the center of the sixth semiconductor element 96 included in the second element group is disposed between the centers of the second semiconductor element 92 and the third semiconductor element 93 which are included in the first element group, in the direction orthogonal to the arrangement direction of the output terminals 34, 35, 36 and the ground terminals 37, 38, 39.

In the case where the device main body 20 includes the sealing resin 50, the sealing resin 50 seals the power supply wiring board 24, the output wiring boards 28, 29, 30, and the ground wiring boards 25, 26, 27 so that the second main surfaces of the power supply wiring board 24, the output wiring boards 28, 29, 30, and the ground wiring boards 25, 26, 27 (the surface opposite to the first main surface, i.e., the lower surface 20b of the device main body 20) are exposed. Additionally, as shown in FIG. 1, through holes 51, 51 penetrating the sealing resin 50 in the thickness direction of the power supply wiring board 24, the output wiring boards 28, 29, 30, and the ground wiring boards 25, 26, 27 may be formed in the sealing resin 50.

As shown in FIG. 1, it is preferable that the through holes 51, 51 of the sealing resin 50 are formed at both ends of the sealing resin 50 in the direction orthogonal to the arrangement direction of the output terminals 34, 35, 36 and the ground terminals 37, 38, 39.

Materials of the power supply wiring board 24, the ground wiring boards 25, 26, 27, the output wiring boards 28, 29, 30, the gate wiring boards 81 to 86, the power supply terminals 31, 32, 33, the output terminals 34, 35, 36, the ground terminals 37, 38, 39, and the gate terminals 61 to 66 are not particularly limited, but may be, for example, materials to be used for general lead frames, such as copper.

The sealing resin 50 is not particularly limited, but may be, for example, a material to be generally used for sealing a semiconductor device.

Figure 2:
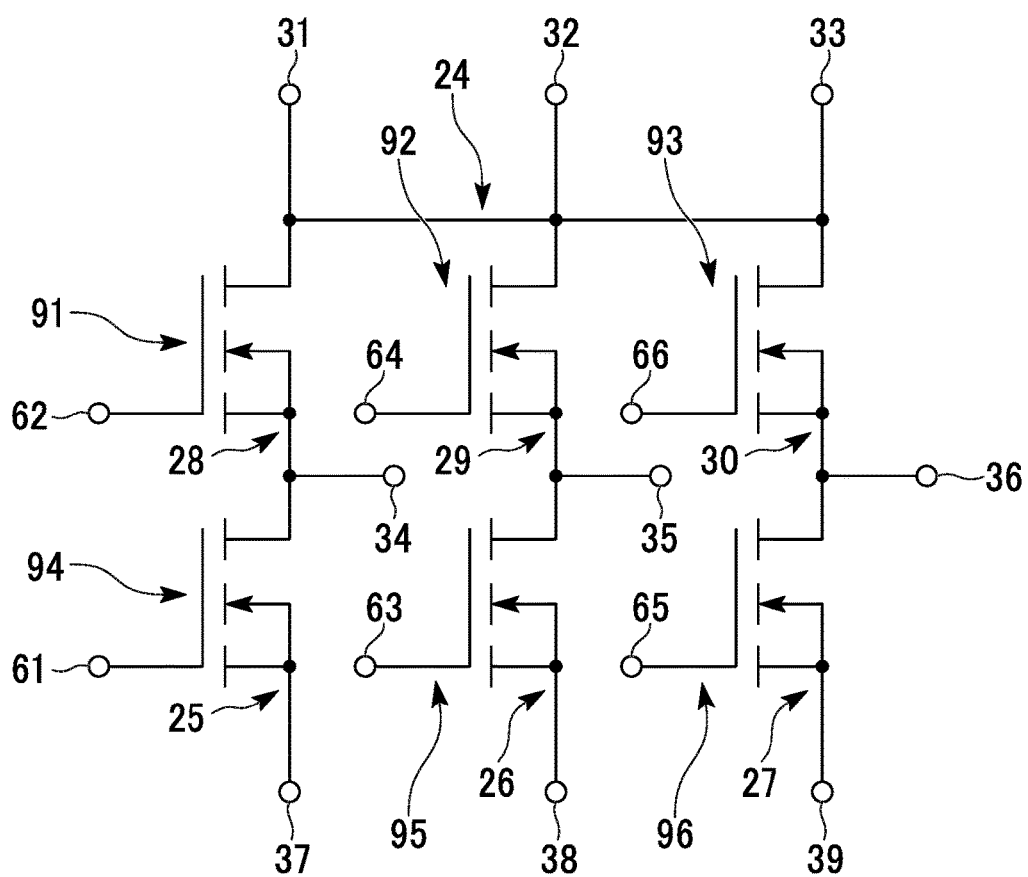
FIG. 2 is an example of a circuit diagram of the semiconductor device according to the present embodiment.

An example of a circuit diagram of the semiconductor device 10 of the present embodiment is as shown in FIG. 2. In the embodiment shown in FIGS. 1 and 2, the first semiconductor element 91, the second semiconductor element 92, the third semiconductor element 93, the fourth semiconductor element 94, the fifth semiconductor element 95, and the sixth semiconductor element 96 are switching elements each including a drain electrode, a source electrode, and a gate electrode. In this case, the semiconductor device 10 of the present embodiment can be used for controlling operation of a motor (e.g., a three-phase motor).

In the semiconductor device 10 of the present embodiment, the power supply terminals 31, 32, 33 are connected to a DC power supply (not shown).

When a direct current flows through the power supply terminals 31, 32, 33, and a gate signal is intermittently applied to the gate electrodes of the semiconductor elements 91, 92, 93 which are switching elements, a direct current intermittently flows in the first current paths 71, 73, 75 from the power supply terminals 31, 32, 33 toward the output terminals 34, 35, 36. On the other hand, when a gate signal is intermittently applied to the gate electrodes of the semiconductor elements 94, 95, 96 which are switching elements, an alternate current flows in the second current paths 72, 74, 76 between the output terminals 34, 35, 36 and the ground terminals 37, 38, 39.

Although the semiconductor device 10 including the three circuit units 41, 42, 43 has been illustrated in present embodiment, the present embodiment is not limited thereto. It is sufficient that the semiconductor device of the present embodiment includes at least one circuit unit.

Figure 3:
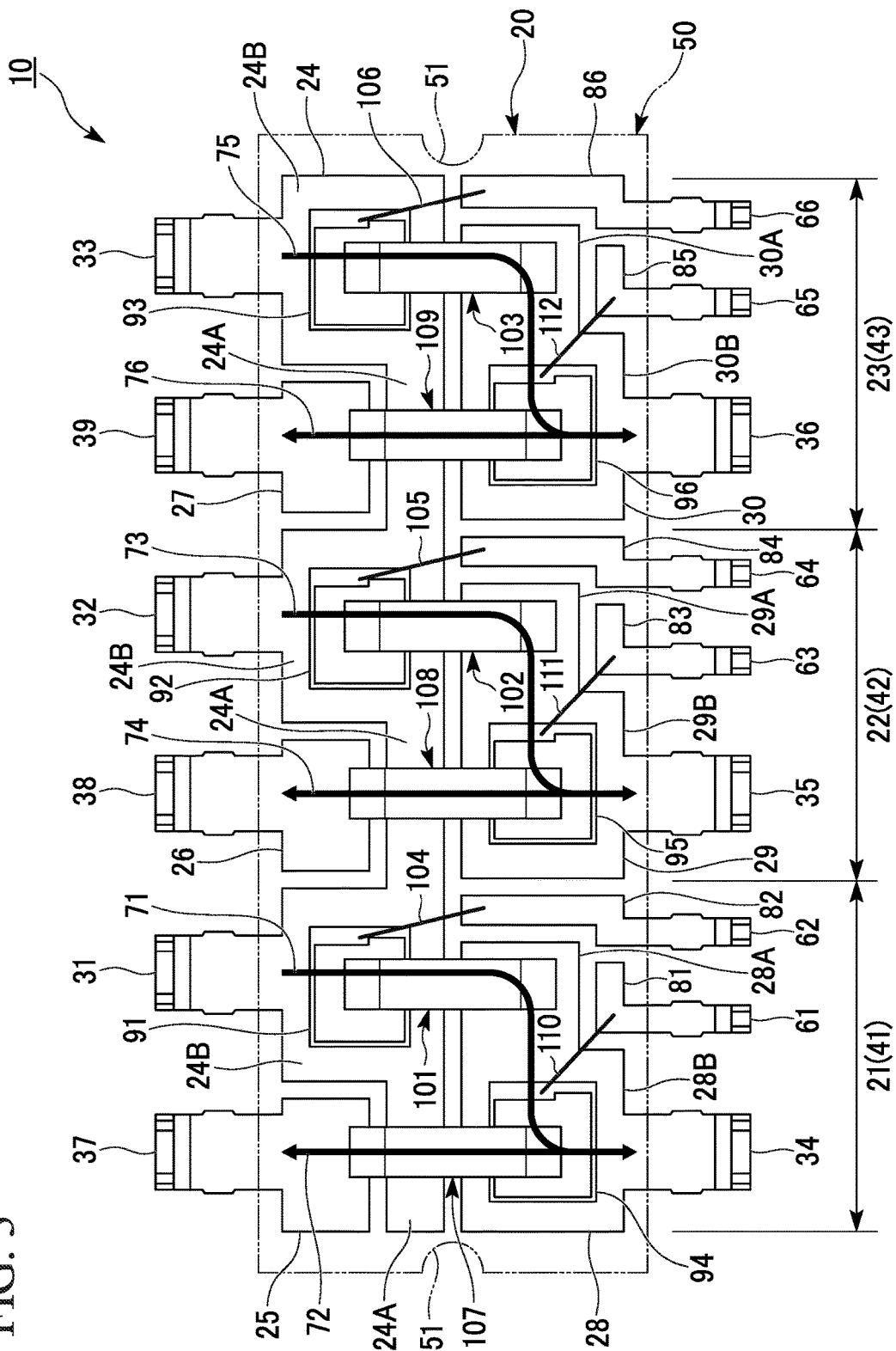
FIG. 3 is a structural plan view showing another example of a semiconductor device according to the present embodiment.

Although the case where bonding wires are used as the connectors 101, 102, 103, 107, 108, 109 has been illustrated in the present embodiment as shown in FIG. 1, the present embodiment is not limited thereto. As shown in FIG. 3, the connectors 101, 102, 103, 107, 108, 109 according to present embodiment may be conductive board materials.

Figure 4:
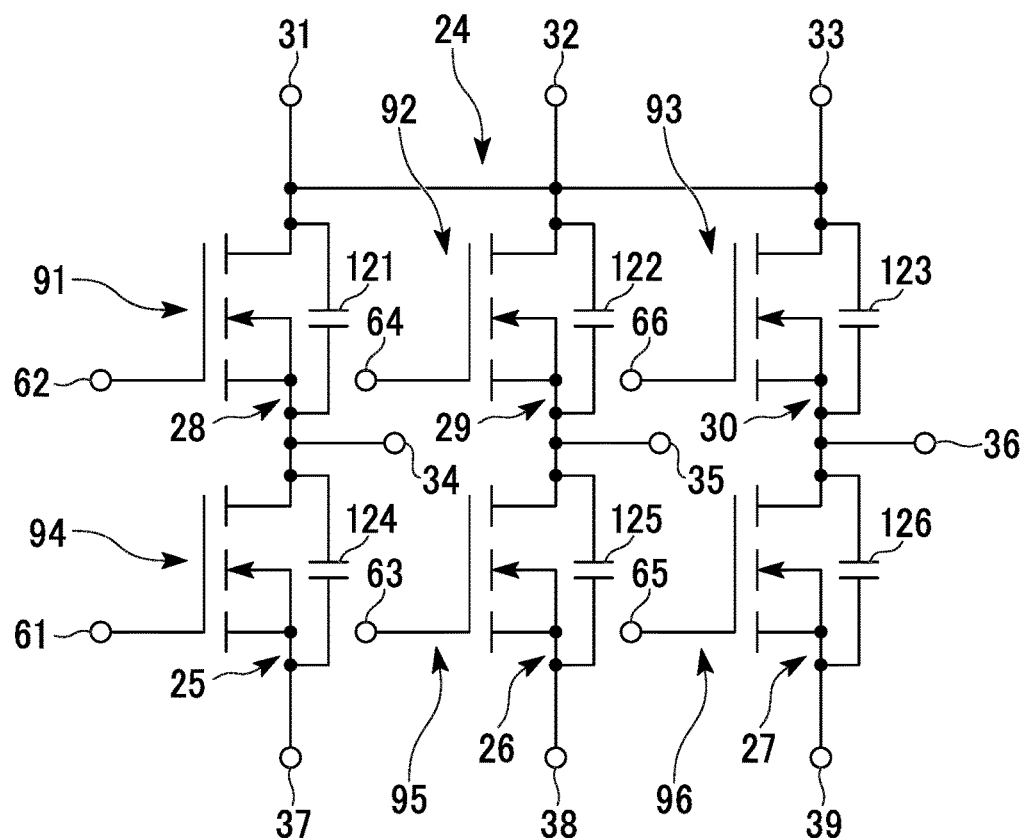
FIG. 4 is another example of a circuit diagram of the semiconductor device according to the present embodiment.
Figure 5:
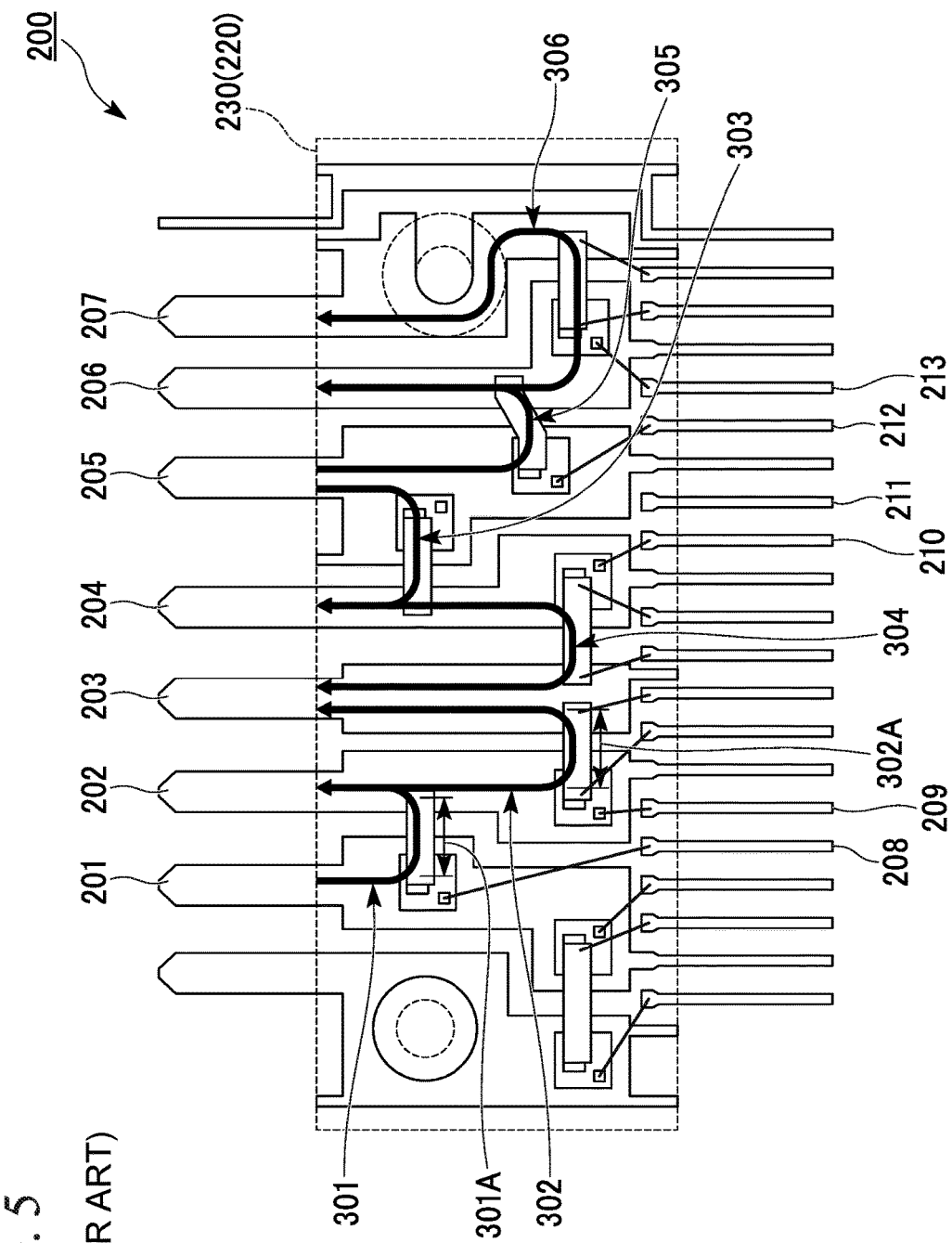
FIG. 5 is a structural plan view showing an example of a conventional semiconductor device.

As shown in FIG. 4, the semiconductor device 10 of the present embodiment may be configured such that the power supply wiring board 24 and the output wiring boards 28, 29, 30 are connected by capacitors 121, 122, 123, and the output wiring boards 28, 29, 30 and the ground wiring boards 25, 26, 27 are connected by capacitors 124, 125, 126. In other words, the circuit units 41, 42, 43 of the present embodiment may include the capacitors 121 to 126.

In FIG. 4, the capacitors 121 to 123 are connected in parallel with the semiconductor elements 91 to 93, between the power supply wiring board 24 and the output wiring boards 28 to 30. Additionally, the capacitors 124 to 126 are connected in parallel with the semiconductor elements 94 to 96, between the output wiring boards 28, 29, 30 and the ground wiring boards 25, 26, 27.

According to the semiconductor device 10 of this embodiment, the output terminals 34, 35, 36 protrude from the device main body 20 in the opposite direction to the ground terminals 37, 38, 39, while the power supply terminals 31, 32, 33 protrude in the same direction as the ground terminals 37, 38, 39 and are positioned so as to be shifted in the direction orthogonal to the arrangement direction of the output terminals 34, 35, 36 and the ground terminals 37, 38, 39. For this reason, such folded-back portions as in the conventional case do not appear in the first current paths 71, 73, 75 and the second current paths 72, 74, 76. This makes it possible to shorten the lengths of the first current paths 71, 73, 75 and the second current paths 72, 74, 76. Additionally, such folded-back portions as in the conventional case do not appear in the first current paths 71, 73, 75 and the second current paths 72, 74, 76, thereby making it possible to downsize the semiconductor device 10. Further, since the first current paths 71, 73, 75 and the second current paths 72, 74, 76 are shortened in length, the impedance and the inductance of the semiconductor device 10 can be reduced.

According to the semiconductor device 10 of the present embodiment, the three circuit units 41, 42, 43 have the gate terminals 61 to 66 protruding from the device main body 20, and the power supply terminals 31, 32, 33 protrude from the device main body 20 in the opposite direction to the gate terminals 61 to 66. For this reason, the semiconductor device 10 can be downsized in the long-side direction while ensuring the pitch between the power supply terminals 31, 32, 33 and the ground terminals 37, 38, 39, and the pitch between the output terminals 34, 35, 36 and the gate terminals 61 to 66.

According to the semiconductor device 10 of the present embodiment, the power supply terminals 31, 32, 33, the output terminals 34, 35, 36, and the ground terminals 37, 38, 39 are larger in width than the gate terminals 61 to 66. For this reason, it is possible to downsize the semiconductor device 10 while suppressing the electrical loss in the semiconductor device 10. Since a large current flows through the power supply terminals 31, 32, 33, the output terminals 34, 35, 36, and the ground terminals 37, 38, 39, by widening these terminals in width, the electric resistance at these terminals can be kept small, and electrical loss at these terminals can be suppressed. On the other hand, since only a small current flows through the gate terminals 61 to 66, even if these terminals are narrowed in width, electrical loss at these terminals can be suppressed.

According to the semiconductor device 10 of the present embodiment, the three circuit units 41, 42, 43 are included.

For this reason, the unit for controlling operation of a motor or the like can be made compact.

According to the semiconductor device 10 of the present embodiment, in the three circuit units 41, 42, 43, the lengths of the first current paths 71, 73, 75 correspond to one another, while the lengths of the second current paths 72, 74, 76 correspond to one another. For this reason, in the circuit units 41, 42, 43, variation in loss due to the difference in current paths is reduced. Thereby, the output (power) of the semiconductor device 10 can be increased.

According to the semiconductor device 10 of the present embodiment, the arrangement of the power supply wiring board 24, the ground wiring boards 25, 26, 27, and the output wiring boards 28, 29, 30, and the arrangement of the semiconductor elements 91 to 96 are the same among the three circuit units 41, 42, 43. For this reason, it is possible to efficiently mount the semiconductor elements 91 to 96 on the power supply wiring board 24 and the output wiring boards 28, 29, 30. It is possible to efficiently electrically connect the power supply wiring board 24 and the output wiring boards 28, 29, 30 via the connectors 101, 102, 103. It is possible to efficiently electrically connect the ground wiring boards 25, 26, 27 and the output wiring boards 28, 29, 30 via the connectors 107, 108, 109.

According to the semiconductor device 10 of the present embodiment, the ground wiring boards 25, 26, 27 are arranged so as to respectively face the wide portions 28B, 29B, 30B of the output wiring boards 28, 29, 30, while the wide portions 24B of the power supply wiring board 24 are disposed so as to face the respective narrow portions 28A, 29A, 30A of the output wiring boards 28, 29, 30. For this reason, the first current paths 71, 73, 75 and the second current paths 72, 74, 76 can be simplified.

According to the semiconductor device 10 of the present embodiment, the power supply wiring board 24 has the plurality of narrow portions 24A and wide portions 24B. For this reason, the heat generated in the three semiconductor elements 91, 92, 93 arranged on the respective wide portions 24B of the power supply wiring board 24 can be uniformly dissipated throughout the power supply wiring board 24. In other words, it is possible to improve the heat dissipation efficiency.

According to the semiconductor device 10 of the present embodiment, the semiconductor elements 91, 92, 93 arranged on the first main surface 24a of the wide portions 24B of the power supply wiring board 24, and the narrow portions 28A, 29A, 30A of the output wiring boards 28, 29, 30 are connected respectively by the connectors 101, 102, 103. Additionally, the semiconductor elements 94, 95, 96 arranged respectively on the first main surfaces 28a, 29a, 30a of the wide portions 28B, 29B, 30B of the output wiring boards 28, 29, 30, and the ground wiring boards 25, 26, 27 are connected respectively by the connectors 107, 108, 109. For this reason, the heat generated in the semiconductor elements 91, 92, 93 can be efficiently transferred to the narrow portions 28A, 29A, 30A of the output wiring boards 28, 29, 30 through the connectors 101, 102, 103. Additionally, heat generated in the semiconductor elements 94, 95, 96 can be efficiently transmitted to the ground wiring boards 25, 26, 27 through the connectors 107, 108, 109. Therefore, the heat dissipation efficiency of the semiconductor device 10 can be improved.

According to the semiconductor device 10 of the present embodiment, the connectors 101, 102, 103, 107, 108, 109 are conductive board materials. Since board materials are smaller in electric resistance than bonding wires, the electrical loss in the semiconductor device 10 can be reduced.

Additionally, since the board materials are higher in thermal conductivity than bonding wires, it is possible to further improve the heat dissipation efficiency of the semiconductor device 10.

According to the semiconductor device 10 of the present embodiment, the three power supply terminals 31, 32, 33 and the power supply wiring board 24 are integrally formed. Additionally, the output terminals 34, 35, 36 and the output wiring boards 28, 29, 30 are integrally formed. Further, the ground terminals 37, 38, 39 and the ground wiring boards 25, 26, 27 are integrally formed. For this reason, it is possible to downsize the semiconductor device 10 while suppressing the electrical loss in the semiconductor device 10.

According to the semiconductor device 10 of the present embodiment, the device main body 20 includes the sealing resin 50 sealing the power supply wiring board 24, the output wiring boards 28, 29, 30, and the ground wiring boards 25, 26, 27 such that the second main surfaces (one main surfaces) of the power wiring board 24, the output wiring boards 28, 29, 30, and the ground wiring boards 25, 26, 27 are exposed. Additionally, the through holes 51, 51 penetrating the sealing resin 50 in the thickness direction of the power supply wiring board 24, the output wiring boards 28, 29, 30, and the ground wiring boards 25, 26, 27 are formed in the sealing resin 50. For this reason, the semiconductor device 10 can be fixed to a heat dissipation member by screwing using the through holes 51, 51. By this fixing, the second main surfaces of the power supply wiring board 24, the output wiring boards 28, 29, 30, and the ground wiring boards 25, 26, 27 (the lower surface of the device main body 20) can be pressed against the heat dissipation member. This makes it possible to ensure contact between the heat dissipation member and the second main surfaces of the power supply wiring board 24, the output wiring boards 28, 29, 30, and the ground wiring boards 25, 26, 27, so that the heat generated in the semiconductor elements 91 to 96 can be efficiently released from the second main surfaces of these wiring boards to the heat dissipation member.

According to the semiconductor device 10 of the present embodiment, the through holes 51, 51 are formed at both ends of the sealing resin 50 in the direction orthogonal to the arrangement direction of the output terminals 34, 35, 36 and the ground terminals 37, 38, 39. For this reason, it is possible to secure surface contact between the heat dissipation member and the second main surfaces of the power source wiring board 24, the output wiring boards 28, 29, 30, and the ground wiring boards 25, 26, 27 (the lower surface 20b of the device main body 20). This makes it possible to more efficiently release the heat generated in the semiconductor elements 91 to 96 from the second main surfaces of these wiring boards to the heat dissipation member.

According to the semiconductor device 10 of the present embodiment, the tip end portions of the power supply terminals 31, 32, 33, the output terminals 34, 35, 36, and the ground terminals 37, 38, 39 extend in the thickness direction of the power supply wiring board 24, the output wiring boards 28, 29, 30, and the ground wiring boards 25, 26, 27, so as to protrude from the first main surfaces of the power wiring board 24, the output wiring boards 28, 29, 30, and the ground wiring boards 25, 26, 27, which oppose the second main surfaces of the power wiring board 24, the output wiring boards 28, 29, 30, and the ground wiring boards 25, 26, 27. For this reason, the semiconductor device 10 can be connected to a circuit board or the like at a position away from the heat radiation member.

According to the semiconductor device 10 of the present embodiment, the power supply wiring board 24 and the output wiring boards 28, 29, 30 are connected by the capacitors 121, 122, 123, while the output wiring boards 28, 29, 30 and the ground wiring board 25, 26, 27 are connected by capacitors 124, 125, 126. In a case where the semiconductor elements 91 to 96 are switching elements such as MOF-FETs or IGBTs to be mounted on on-vehicle electrical equipment, a current is intermittently flowed by switching the semiconductor elements 91 to 96. By providing the semiconductor device 10 with the capacitors 121 to 126, voltage fluctuation at the time of switching the semiconductor elements 91 to 96 can be reduced.

According to the semiconductor device 10 of the present embodiment, the semiconductor elements 91, 92, 93 arranged on the respective wide portions 24B of the power supply wiring board 24 are arranged separately in the direction orthogonal to the arrangement direction of the output terminals 34, 35, 36 and the ground terminals 37, 38, 39 to constitute the first element group. The semiconductor elements 94, 95, 96 arranged on the respective wide portions 28B, 29B, 30B of the output wiring boards 28, 29, 30 are arranged separately in the direction orthogonal to the arrangement direction of the output terminals 34, 35, 36 and the ground terminals 37, 38, 39 to constitute the second element group. The center of each of the semiconductor element boards 95, 96 included in the second element group is positioned between the centers of two adjacent semiconductor elements of the semiconductor elements 91, 92, 93 included in the first element group in the direction orthogonal to the arrangement direction of the output terminals 34, 35, 36 and the ground terminals 37, 38, 39. For this reason, the first current paths 71, 73, 75 and the second current paths 72, 74, 76 can be further simplified. Additionally, it is possible to equalize the heat distribution in the device main body 20 based on the heat generated in the semiconductor elements 91 to 96. In other words, it is possible to prevent the concentration of heat in the device main body 20 and to improve the heat dissipation efficiency of the semiconductor device 10.

DESCRIPTION OF REFERENCE NUMERALS

10 semiconductor device
20 device main body
21, 22, 23 device unit
24 power supply wiring board
25, 26, 27 ground wiring board
28, 29, 30 output wiring board
31, 32, 33 power supply terminal board
34, 35, 36 output terminal
37, 38, 39 ground terminal
41, 42, 43 circuit unit
50 sealing resin
51 through hole
61, 62, 63, 64, 65, 66 gate terminal
71, 73, 75 first current path
72, 74, 76 second current path
81, 82, 83, 84, 85, 86 gate wiring board
91, 92, 93, 94, 95, 96 semiconductor element
101, 102, 103, 104, 105, 106, 107, 108, 109, 110, 111, 112 connector
121, 122, 123, 124, 125, 126 capacitor

The invention claimed is:

1. A semiconductor device comprising:
   at least one circuit unit including
     a device main body, and
     a power supply terminal, an output terminal, gate terminals, and a ground terminal which protrude from the device main body,
   wherein the output terminal protrudes from the device main body in an opposite direction to the ground terminal,
   the power supply terminal protrudes in a same direction as the ground terminal and is positioned so as to be shifted in a direction orthogonal to an arrangement direction of the output terminal and the ground terminal,
   the power supply terminal protrudes from the device main body in an opposite direction to the gate terminals,
   the power supply terminal, the output terminal, and the ground terminal are larger in width than the gate terminals,
   the device main body comprises
     a power supply wiring board connected to the power supply terminal,
     a ground wiring board connected to the ground terminal,
     an output wiring board connected to the output terminal, and
     gate wiring boards connected respectively to the gate terminals,
   the power supply wiring board has plural pairs of narrow portions and wide portions continuously extending in the direction orthogonal to the arrangement direction of the output terminal and the ground terminal,
   the output wiring board has a narrow portion and a wide portion continuously extending in the direction orthogonal to the arrangement direction of the output terminal and the ground terminal,
   the ground wiring board is disposes so as to face the wide portion of the output wiring board via the narrow portion of the power supply wiring board,
   the wide portion of the power supply wiring board is disposed so as to face the narrow portion of the output wiring board,
   the wide portion of the power supply wiring board in a same direction as the power supply terminal with respect to the narrow portion of the power supply wiring board,
   the wide portion of the output wiring board protrudes in a same direction as the output terminal with respect to the narrow portion of the output wiring board,
   the ground wiring board is adjacent to the narrow portion of the power supply wiring board on a side of a surface of the power supply wiring board toward which the wide portion of the power supply wiring board protrudes, and
   the gate wiring boards include
     a first gate wiring board adjacent to the narrow portion of the output wiring board, and
     a second gate wiring board disposed between the output wiring boards of two adjacent circuit units.

2. The semiconductor device according to claim 1, wherein
   a length of a first current path from the power terminal to the output terminal included in any one of the circuit units corresponds to a length of the first current path included in any other one of the circuit units, and
   a length of a second current path from the output terminal to the ground terminal included in any one of the circuit units corresponds to a length of the second current path included in any other one of the circuit units.

3. The semiconductor device according to claim 1, wherein
   a semiconductor element disposed on a first main surface of the wide portion of the power supply wiring board, and the narrow portion of the output wiring board are connected by a connector, and
   a semiconductor element disposed on a first main surface of the wide portion of the output wiring board, and the ground wiring board are connected by a connector.

4. The semiconductor device according to claim 3, wherein
   the connectors are conductive board materials.

5. The semiconductor device according to claim 3, wherein
   the power supply terminal and the power supply wiring board are integrally formed,
   the output terminal and the output wiring board are integrally formed
   the ground terminal and the ground wiring board are integrally formed, and
   the gate terminals and the gate wiring boards are integrally formed.

6. The semiconductor device according to claim 3, wherein
   the device main body comprises a resin sealing the power supply wiring board, the output wiring board, and the ground wiring board so that second main surfaces of the power supply wiring board, the output wiring board, and the ground wiring board are exposed, and
   a through hole penetrating through the resin in a thickness direction of the power supply wiring board, the output wiring board, and the ground wiring board is formed in the resin.

7. The semiconductor device according to claim 6, wherein
   the through hole is formed at each of both ends of the resin in the direction orthogonal to the arrangement direction of the output terminal and the ground terminal.

8. The semiconductor device according to claim 6, wherein
   respective tip end portions of the power supply terminal, the output terminal, and the ground terminal extend in the thickness direction of the power supply wiring board, the output wiring board, and the ground wiring board so as to protrude from the first main surfaces of the power supply terminal, the output terminal, and the ground terminal, which oppose the second main surfaces of the power supply terminal, the output terminal, and the ground terminal.

9. The semiconductor device according to claim 5, wherein
   the power supply wiring board and the output wiring board are connected by a capacitor, and
   the output wiring board and the ground wiring board are connected by a capacitor.

10. The semiconductor device according to claim 3, wherein
    semiconductor elements respectively disposed on the wide portions of the power supply wiring board are arranged separately in the direction orthogonal to the arrangement direction of the output terminal and the ground terminal to constitute a first element group,
    semiconductor elements respectively disposed on the wide portions of the output wiring boards are arranged separately in the direction orthogonal to the arrangement direction of the output terminal and the ground terminal to constitute a second element group,
    a center of each of the semiconductor elements included in the second element group is positioned between centers of two adjacent semiconductor elements included in the first element group in the direction orthogonal to the arrangement direction of the output terminal and the ground terminal.

* * * * *